United States Patent
Zhong et al.

[11] Patent Number: 6,124,927
[45] Date of Patent: Sep. 26, 2000

[54] METHOD TO PROTECT CHAMBER WALL FROM ETCHING BY ENDPOINT PLASMA CLEAN

[75] Inventors: Qinghua Zhong; Zou Zheng; Yelehanka Ramachandra Murthy Pradeep; Zhou Mei Sheng, all of Singapore, Singapore

[73] Assignee: Chartered Semiconductor Manufacturing Ltd., Singapore, Singapore

[21] Appl. No.: 09/314,589

[22] Filed: May 19, 1999

[51] Int. Cl.[7] ............................... G01J 3/30; C23C 16/00
[52] U.S. Cl. ..................... 356/311; 356/316; 118/712; 118/713
[58] Field of Search ..................... 118/712, 713; 156/345; 356/311, 316

[56] References Cited

U.S. PATENT DOCUMENTS

| | | | |
|---|---|---|---|
| 5,465,154 | 11/1995 | Levy | 356/382 |
| 5,468,686 | 11/1995 | Kawamoto | 437/229 |
| 5,712,702 | 1/1998 | McGahay et al. | 356/311 |
| 5,811,356 | 9/1998 | Murugesh et al. | 438/711 |
| 5,824,375 | 10/1998 | Gupta | 427/569 |
| 5,985,032 | 11/1999 | Eriguchi | 118/712 |

*Primary Examiner*—Frank G. Font
*Assistant Examiner*—Layla Lauchman
*Attorney, Agent, or Firm*—George O. Saile; Rosemary L. S. Pike

[57] ABSTRACT

A new method of controlling the level of cleaning of the etch chamber by measuring the light emission caused by particles within the plasma of the etch chamber. The etch chamber clean process is invoked as soon as the level of contaminants within the etch chamber is observed as being too high. This measuring of the contaminants within the etch chamber is performed by measuring the particle light emission. The etch chamber cleaning process is considered complete when the light intensity created by existing particles in the chamber drops by a certain percentage.

12 Claims, 2 Drawing Sheets

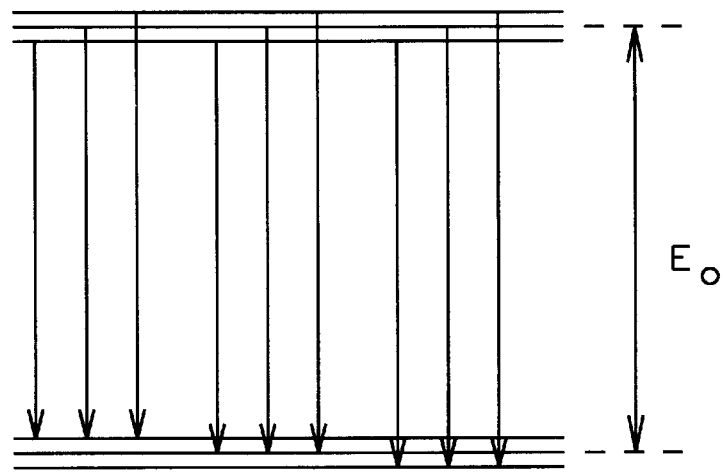
FIG. 1 - Prior Art
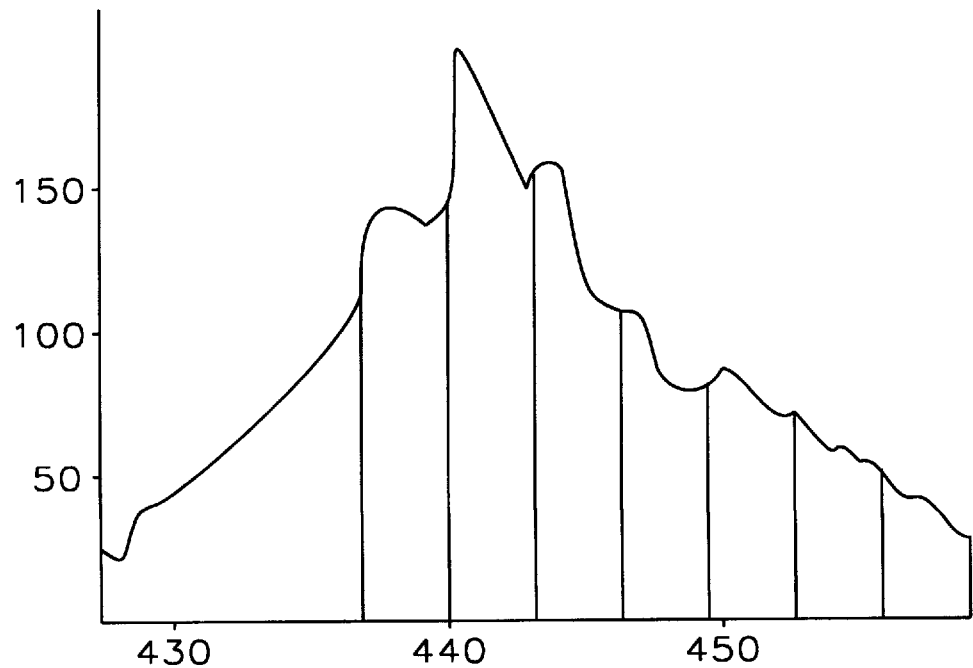
FIG. 2 - Prior Art

METHOD TO PROTECT CHAMBER WALL FROM ETCHING BY ENDPOINT PLASMA CLEAN

BACKGROUND OF THE INVENTION (1) Field of the Invention

The invention relates to the fabrication of integrated circuit devices, and more particularly to an improved method and procedure of plasma chamber cleaning procedures.

(2) Description of the Prior Art

Due to its superior performance over wet etching, plasma dry etching has been broadly applied in present semiconductor manufacturing to form active areas, lines, holes and other features created for the construction of the devices. During plasma dry etching, processing gases are introduced into an etching chamber where they are excited by radiation frequency (rf) electromagnetic waves to form reactive etchants. The etchants react with the unmasked substrate areas and form volatile species departing from the substrate thereby forming desired features of a semiconductor device. The plasma becomes a complex mixture of native etching gases and etched products, including molecules, ions, neutral radicals and other species.

Some by-products can deposit on the insides of the chamber walls and cause serious problems as they accumulate to a particular density. For example, in addition to affecting the chamber processing conditions thereby degrading the processing stability, the accumulated by-products on the chamber walls may dislodge (from the chamber walls) and settle down on the surface of the substrate causing fatal defects that are likely to negatively affect the entire chip. Therefore, the removal of the accumulated by-products becomes extremely important. In-situ plasma dry cleaning is desirable due to its efficiency. During plasma dry cleaning, cleaning gases are introduced into the chamber. The cleaning gasses interact with the by-products (of the process taking place in the chamber) and form volatile species that are pumped out-off the chamber thereby realizing a "cleaning" of this chamber. With this technique, it is not necessary to open the chamber for cleaning; thus no time-consuming machine-setup is required after cleaning. However, the highly reactive cleaning gasses may also attack the chamber wall and shorten its lifetime. Currently, time-mode is typically used for plasma dry cleaning. In this time-mode the cleaning process is performed for a fixed period of time to remove the by-products accumulated on the chamber walls. It is obvious that either under-cleaning or over-cleaning is very likely to occur. The former causes insufficient by-product removal while the latter results in erosion of the chamber wall. In addition, non-volatile aluminum fluoride may be formed as the cleaning plasma attacks the chamber wall during over-cleaning, resulting in an aluminum fluoride particle problem. Therefore, the most desirable approach becomes an endpoint mode that does not result in significant erosion of the chamber walls by the plasma that is formed in the chamber during the process of cleaning. This method of endpoint detection must however by very reliable. The essence of the invention is to provide a method for endpoint-controlled plasma dry cleaning that is based on the optical emission spectrum of the plasma that is formed inside the chamber during the process of cleaning the chamber. Optical emission has previously been utilized in plasma dry etching for endpoint detection. Each kind of molecule or atom has its characteristic optical emission at specific wavelengths. While an overlying layer is being removed, the underlying layer may become exposed to the etching plasma. Thus, different etching by-products are expected to enter the plasma (within the chamber) and accordingly cause a change in the plasma optical emission spectrum. This change in the plasma optical emission spectrum is used to detect the etching endpoint. The objective of the invention is to introduce the principle of endpoint-controlled processing into plasma dry cleaning. When the cleaning plasma etches away the accumulated by-products, related product species may be formed. These related product species can be identified by their unique and characteristic optical emission. After the accumulated by-products have been removed from the chamber and the chamber walls are exposed to the plasma, there is a change in the optical emission. This change in optical emission can be used to detect the endpoint of the cleaning process and to therefore stop the cleaning process.

An in-depth grasp of the cleaning process depends on an understanding of the molecule/atom excitation and decay transition mechanism. In a molecule or atom, electrons are present in various states of energy distribution in which the individual electrons have their specific energies. As an electron transits (decays) from a higher energy state to a state of lower energy, the electron emits a photon that possesses energy equal to the difference between the two energies of the two orbits of the electron. Because a given molecule/atom has a specific energy state structure, that is a specific energy level structure, the energy of the emitted photon, and therefore its wavelength, is characteristic of the molecule/atom. In other words, each kind of molecule/atom corresponds to its characteristic optical emission spectrum by which the molecule/atom is theoretically identifiable. In plasma, the various species of the plasma have (their characteristic) electrons that, when the electrons decay from a higher energy level to a lower energy level, are excited and as a consequence emit their characteristic spectra. As the plasma etching has removed an overlying layer and penetrates to the underlying material, different products are generated; thus a change in the emission spectra takes place. This change is used to signal the endpoint.

Molecular theory teaches that, for actual molecules/atoms combinations, one state of the molecules/atoms combination usually does not correspond to a single energy level, but to a series of adjacent sub-energy levels as shown in FIG. 1. The reason is that the single energy level (corresponding to a particular state) splits into multi-levels due to such factors as vibration and angular momentum coupling. Electrons decay from a higher level of energy to a lower level and, as a consequence, emit photons during this decaying process. Each energy level as shown in FIG. 1 consists of a series of sub-energy levels due to the "energy-level splitting".

This variety of factors contributes to the highly irregular pattern of energy or emission intensity as a function of wavelength that is observed in a typical emission spectra, FIG. 2. The emission intensity has been plotted along the Y-axis while the wavelength (in nm) has been plotted along the X-axis. The emission spectrum that is shown in FIG. 2 derives its characteristics from the material of which the emitting source, in this case the plasma in the chamber, is made and from the way in which the material is exited. The sub-peaks shown in FIG. 2 result from the above indicated "energy-level splitting" effect. Specifically shown in FIG. 2 is the electromagnetic energy generated by Si—F, which has a wavelength of optical emission within the range between about 430 and 460 nm.

U.S. Pat. No. 5,465,154 (Levy) teaches a method of monitoring the etch rate of materials using a light beam.

U.S. Pat. No. 5,468,686 (Kawamoto) shows a method of cleaning an etch chamber.

U.S. Pat. No. 5,712,702 (McGhahay et al.) shows a method to determine the chamber clean end point by sensing the exhaust.

U.S. Pat. No. 5,811,356 (Murugesh et al.) shows a chamber seasoning method.

U.S. Pat. No. 5,824,375 (Gupta) shows a decontamination of a chamber after plasma clean.

SUMMARY OF THE INVENTION

It is the primary objective of the invention to control the plasma dry-cleaning process by monitoring the optical emission of the plasma and by thereby providing a method of endpoint-mode detection.

It is another objective of the invention to control the plasma dry-cleaning process by monitoring the optical emission of Si—F species in the plasma for processes whose by-products are predominantly Si-based.

It is yet another objective of the invention to monitor the optical emission of Si—F species in the plasma where this optical emission is within a range of wavelengths between 430 and 460 nm.

In accordance with the objectives of the invention, a new method of controlling the cleaning of the etch chamber is achieved. During Prior Art etch chamber clean operations, a time-mode process is used to clean the etch chamber. That is: the cleaning process is performed for a fixed period of time to remove the by-products that have accumulated on the chamber walls. Under the invention, endpoint-mode control is provided by monitoring, during the process of cleaning the etch chamber, the optical emission that originates from the plasma that is present in the chamber. The invention can be directed at endpoint detection for the etching of special materials. For instance, for Si-based material etching, various Si-based by-products are formed. A fluorine based etching gas is used to clean the accumulated Si-base products forming Si—F species. By monitoring the drop in the intensity of Si—F optical emission (created by the plasma in the etch chamber during the process of cleaning the chamber), the endpoint for the cleaning cycle can be identified at which point no more cleaning plasma is allowed to enter the chamber.

BRIEF DESCRIPTION OF THE DRAWINGS

FIG. 1 shows an illustration of the photon emission mechanism.

FIG. 2 shows the optical emission spectrum of Si—F in the 430 to 460 nm wavelength range.

DESCRIPTION OF THE PREFERRED EMBODIMENT

Figure 3:
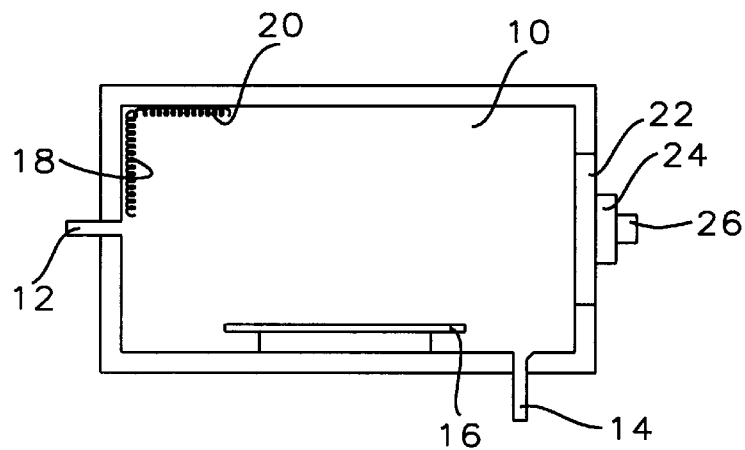
FIG. 3 shows a schematic of the plasma dry etching chamber design.

Referring now specifically to FIG. 3, there is shown a cross section of the etch chamber 10, an etch gas inlet point 12, an etch gas outlet or suction point 14. The accumulation 18 of the cleaning by-products inside the etch chamber is indicated in the area of the etch gas entry point 12, the accumulation 20 on the ceiling of the etch chamber is also highlighted. The window 22 is provided in the main body of the etch chamber, the inside of the etch chamber 10 can be observed via this window 22 while optical emission that is radiated from the inside of the etch chamber through this window 22 can be observer and measured. A light filter 24 can select or filter certain selected frequencies from the optical emission that is to be measured, the emission monitor 26 measures the intensity of the optical emission that is being measured.

This invention teaches a method of controlling the dry cleaning process by monitoring the optical emission of the by-products that are formed during the process of plasma dry-cleaning. For example, in Si-based material etching, various Si-based by-products may be produced that deposit on the chamber wall thereby affecting processing performance. Fluorine containing etching gases are used to clean the accumulated Si-based by-products thereby forming Si—F species. When the cleaning process removes the layer of by-products and exposes the chamber wall to the plasma, a significant drop in the intensity of the Si—F optical emission is observed. This indicates the endpoint of the cleaning process at which point the plasma is shut down to protect the chamber wall from the attack by the plasma. A range of optimum wavelengths that can be used for the endpoint detection is from 430 nm to 460 nm. Any optical emission within this range of wavelengths that originates from Si—F species can be used to reliably detect the endpoint.

Figure 4:
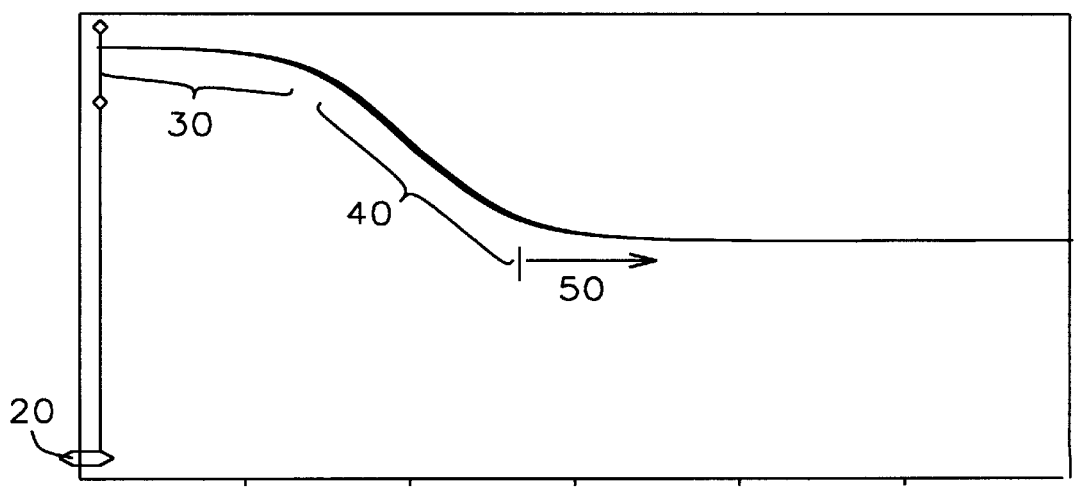
FIG. 4 shows an optical emission intensity trace recorded during the plasma dry cleaning process.

FIG. 4 gives an example of the intensity of the optical emission of the plasma contained within the chamber as a function of time. The emission intensity is plotted along the Y-axis while the time (in seconds) is plotted along the X-axis, the emission as shown in FIG. 4 is the emission spectrum of Si—F in the 430 to 460 nm wavelength range.

The integrated emission intensity is monitored over a (narrow) range of wavelengths that is within the above mentioned optimum wavelength window (430–460 nm). When the plasma is turned on, point 20 in FIG. 4, the above mentioned emission intensity is observed to increase from zero to a certain level 30 after which it remains constant over a period of time. This relatively flat area 30 corresponds to the time that the cleaning process is taking place. A subsequent drop 40 in the intensity is observed, signaling that the removal of the accumulated by-products from the chamber has been completed and indicates the endpoint of the cleaning. The plasma should be turned off before the end of the slope 40 because the subsequent flat area 50 indicates that etching of the chamber wall by the plasma will take place, this latter etching is to be avoided. The absolute emission intensity is meaningless because it depends on specific conditions. But the drop in the intensity is of more significance as indicating the removal of the by-products from the inside of the chamber.

It is clear from the above that the method of monitoring the optical light emission can be used not only the end-point detection of the chamber cleaning process but also to start the process of cleaning the chamber. After the low level of radiation, level 50 in FIG. 4, has been reached, the chamber will be re-used and polymer will again start to build up on the chamber walls while the optical radiation from the chamber walls will again increase. When this radiation has reached a certain level, level 30 in FIG. 4, the chamber needs to be cleaned and therefore the cleaning process can be re-started. It is thereby recognized that the problem of data analysis associated with controlling both the starting and the ending of the cleaning of the chamber may be complex and can therefore most likely only be approached and solved with an automatic, computer controlled system. This however does not in any way reduce the value of the invention or inhibit the implementation of a method based on the invention for both start and end-point detection for the cleaning cycles of the processing chamber.

It will be apparent to those skilled in the art, that other embodiments, improvements, details and uses can be made consistent with the letter and spirit of the present invention and within the scope of the present invention, which is limited only by the following claims, construed in accordance with the patent law, including the doctrine of equivalents.

What is claimed is:

1. A method of detecting the endpoint of cleaning of a polycrystalline silicon etch chamber of a dry polycrystalline silicon etching system said system comprising chamber walls and chamber components which include insulative components and conducting and semiconducting components, wherein said polycrystalline silicon etching chamber has at least one observation window within said chamber walls, comprising:

mounting an optical light filtering apparatus in line with said observation window and on the outside of said dry polycrystalline silicon etch chamber whereby said optical light filtering apparatus is sensitive to passing electromagnetic energy generated by Si—F components of a plasma contained within said polycrystalline silicon etching chamber with a wavelength of optical emission within the range between about 430 and 460 nm;

mounting an optical light intensity measurement apparatus in line with said optical light filtering apparatus whereby said optical light intensity measurement apparatus is sensitive to measuring electromagnetic energy generated by Si—F components of a plasma contained within said polycrystalline silicon etching chamber with a wavelength of optical emission within the range between about 430 and 460 nm;

monitoring intensity of said optical light radiating through said window using said light filtering apparatus further using said optical light intensity measurement apparatus; and terminating said cleaning of said polycrystalline silicon etching chamber at a point in time where said intensity of optical light radiating through said window has reached a certain level.

2. The method of claim 1 wherein said optical light filtering apparatus:

intercepts said optical light radiating through said window of said chamber;

provides capability to partially or completely block said intercepted optical light based on the wavelength of said intercepted optical light; and provides capability to partially or essentially completely pass through said intercepted optical light based on the wavelength of said intercepted optical light.

3. The method of claim 1 wherein said optical light intensity measurement apparatus measures energy or intensity of optical light for optical light of a given wavelength after said light has been passed through said optical light filtering apparatus.

4. The method of claim 1 wherein said monitoring intensity of said optical light is measuring intensity of optical light of a given wavelength.

5. The method of claim 1 wherein said terminating said cleaning of said polycrystalline silicon etch chamber is terminating flow of cleaning plasma into said polycrystalline silicon etch chamber.

6. The method of claim 1 further extending said method to include starting said polycrystalline silicon etch chamber clean process by extending said monitoring intensity of optical light radiating through said window whereby said extended monitoring is:

measuring light intensity of said light radiating through said window as a function of time and as a function of the wavelength of said light;

comparing said measured light intensity with a particular value of light intensity;

determining rate of change of said light intensity;

identifying said rate of change as either positive or negative; comparing said rate of change with particular values of either positive or negative rates of change;

tracking said positive or negative rate of change in combination with said measured light intensity as a function of time; and generating a signal when said tracking has identified a certain pattern whereby said signal differentiates between starting and ending of the cleaning process for said etch chamber.

7. The method of claim 6 wherein said starting said cleaning of said polycrystalline silicon etching chamber is a dry-etch operation.

8. The method of claim 6 wherein starting said cleaning of said polycrystalline silicon etching chamber is a dry-etch operation removing polymer with an element from the group of pure oxygen or HBr or $Cl_2$ or $CF_4$.

9. The method of claim 6 wherein operating conditions for said cleaning of said polycrystalline silicon etching chamber are 15 mT/700 Watts TCP power/100 sccm $SF_6$ flow/20 sccm $Cl_2$ flow/20 sccm $O_2$ flow/time 300 seconds.

10. An apparatus for determining endpoint for a dry etch polycrystalline silicon chamber cleaning process, comprising:

an polycrystalline silicon etch chamber defined by chamber walls and chamber components which include insulative components and conducting and semiconducting components, wherein said etch chamber has at least one observation window within said chamber walls and is adopted for etching of a workpiece;

a means for supporting said workpiece in said chamber;

a light filtering apparatus mounted in line with said observation window and on the outside of said dry etch chamber whereby said optical light filtering apparatus is sensitive to passing the electromagnetic energy generated by Si—F components of a plasma contained within said polycrystalline silicon etching chamber with a wavelength of optical emission within the range between about 430 and 460 nm;

a light intensity measurement apparatus mounted in line with said light filtering apparatus whereby said optical light intensity measurement apparatus is sensitive to measuring the electromagnetic energy generated by Si—F components of a plasma contained within said polycrystalline silicon etching chamber with a wavelength of optical emission within the range between about 430 and 460 nm;

a means for monitoring intensity of light within said chamber; and a means for terminating said cleaning of said etching chamber.

11. The apparatus of claim 10 wherein said optical light filtering apparatus:

intercepts optical light radiating through said window of said chamber;

provides the capability to partially or completely block said intercepted optical light based on the wavelength of said intercepted optical light; and provides the capability to partially or essentially completely pass through said intercepted optical light based on the wavelength of said intercepted optical light.

12. The apparatus of claim 10 thereby further extending the function of said apparatus to include starting said chamber clean process by extending said monitoring intensity of optical light radiating through said window whereby said extended monitoring is:

measuring light intensity of said light radiating through said window as a function of time and as a function of wavelength of said light;

comparing said measured light intensity with a particular value of light intensity;

determining rate of change of said light intensity;

identifying said rate of change as either positive or negative;

comparing said rate of change with particular values of either positive or negative rates of change;

tracking said positive or negative rates of change in combination with said measured light intensity as a function of time; and generating a signal when said tracking has identified a certain pattern whereby said signal differentiates between starting and ending of the cleaning process for said etch chamber.

* * * * *